(12) United States Patent
Suriani et al.

(10) Patent No.: US 11,599,761 B2
(45) Date of Patent: Mar. 7, 2023

(54) ADAPTABLE TRACKING TAG

(71) Applicant: Actall Corporation, Denver, CO (US)

(72) Inventors: Donald Suriani, Loveland, CO (US);
Robert Hampe, Denver, CO (US);
Isaac Davenport, Aurora, CO (US);
Kevin Christensen, Denver, CO (US)

(73) Assignee: ACTALL CORPORATION, Denver, CO (US)

( * ) Notice: Subject to any disclaimer, the term of this patent is extended or adjusted under 35 U.S.C. 154(b) by 0 days.

(21) Appl. No.: 17/151,935

(22) Filed: Jan. 19, 2021

(65) Prior Publication Data
US 2022/0230034 A1 Jul. 21, 2022

(51) Int. Cl.
| G06K 19/06 | (2006.01) |
| G06K 19/07 | (2006.01) |
| H05K 7/14 | (2006.01) |
| H05K 5/06 | (2006.01) |
| H05K 1/18 | (2006.01) |
| H05K 5/00 | (2006.01) |

(52) U.S. Cl.
CPC ..... G06K 19/0723 (2013.01); G06K 19/0702 (2013.01); H05K 1/181 (2013.01); H05K 5/0086 (2013.01); H05K 5/061 (2013.01); H05K 7/1427 (2013.01); H05K 2201/10037 (2013.01); H05K 2201/10098 (2013.01)

(58) Field of Classification Search
CPC .. H05K 5/0026; H05K 5/0086; G06K 19/077; G06K 19/0775

USPC ..... 235/494, 462.45, 462.46, 472.01, 472.02
See application file for complete search history.

(56) References Cited

U.S. PATENT DOCUMENTS

| 5,363,425 | A | * | 11/1994 | Mufti | H04Q 3/625 |
| | | | | | 455/433 |
| 5,627,517 | A | * | 5/1997 | Theimer | G01S 13/78 |
| | | | | | 340/426.2 |
| 6,424,264 | B1 | | 7/2002 | Giraldin et al. | |
| 6,747,562 | B2 | | 6/2004 | Giraldin et al. | |
| 7,034,683 | B2 | * | 4/2006 | Ghazarian | G08B 13/06 |
| | | | | | 340/568.1 |
| 7,605,696 | B2 | | 10/2009 | Quatro | |
| 8,843,155 | B2 | | 9/2014 | Burton et al. | |
| 9,652,955 | B1 | | 5/2017 | Ray et al. | |
| 10,334,707 | B1 | | 6/2019 | Lu et al. | |
| 10,440,535 | B2 | | 10/2019 | Roberts et al. | |
| 10,616,710 | B2 | | 4/2020 | Stitt et al. | |
| 2020/0337162 | A1 | * | 10/2020 | Perkins | H04W 12/47 |

* cited by examiner

*Primary Examiner* — Daniel St Cyr
(74) *Attorney, Agent, or Firm* — MP Patents, LLC

(57) ABSTRACT

A tracking tag system includes a tag case, a first tag case back plate and a second tag case back plate. The tag case has a mating surface and is configured to house a PCB having a transmitter and circuitry for controlling the transmitter. The first tag case back plate is configured to mate with the tag case to enclose and totally protect the PCB, the transmitter, the circuitry and a battery of a first type against ingress of water during immersion and against dust ingress. The second tag case back plate configured to enclose and totally protect the PCB, the transmitter, the circuitry and a battery of a second type against ingress of water during immersion and against dust ingress.

13 Claims, 5 Drawing Sheets

ADAPTABLE TRACKING TAG

TECHNICAL FIELD

The present disclosure pertains to tracking tags used to track location of assets.

SUMMARY

The disclosure describes a tracking tag system. The tracking tag system includes a tag case, a first tag case back plate and a second tag case back plate. The tag case has a mating surface and is configured to house a PCB having a transmitter and circuitry for controlling the transmitter. The first tag case back plate is configured to mate with the tag case to enclose and protect a PCB, a transmitter, circuitry and a battery of a first type against ingress of foreign matter. The second tag case back plate is configured to enclose and protect a PCB, a transmitter, circuitry and a battery of a second type against ingress of foreign matter.

The disclosure also describes a variable ping rate, tracking tag system. The system includes a transmitter configured to emit signals at a ping rate, an accelerometer configured to determine a motion state of the transmitter, a PCB having circuitry for controlling the transmitter and for adapting the ping rate according to the motion state determined by the accelerometer. A tag case houses the transmitter, the accelerometer and the PCB.

Further, the disclosure describes a method for reconfiguring a tracking tag. The method includes, uncoupling a first tag case back plate from a tag case housing a communicatively coupled PCB and transmitter pair, removing a first battery housing mounted to the PCB, mounting a second battery housing to the PCB and coupling a second tag case back plate to the tag case to enclose the PCB and transmitter.

BRIEF DESCRIPTION OF THE FIGURES

The summary above, as well as the following detailed description of illustrative embodiments, is better understood when read in conjunction with the appended drawings. For the purpose of illustrating the disclosure, example constructions are shown in the drawings. However, the disclosure is not limited to specific methods and instrumentalities disclosed herein. Moreover, those having ordinary skill in the art will understand that the drawings are not necessarily to scale. Wherever possible, like elements have been indicated by identical numbers.

Embodiments of the disclosure will now be described, by way of example only, with reference to the following diagrams wherein.

DETAILED DESCRIPTION

The following detailed description illustrates embodiments of the disclosure and manners by which they can be implemented. Although the preferred mode of carrying out disclosed systems, devices and methods has been described, those of ordinary skill in the art would recognize that other embodiments for carrying out or practicing disclosed systems, devices and methods are also possible.

Some real-time location tracking system implementations benefit from a tracking tag with a battery of a first capacity having a first set of dimensions while other implementations benefit from a tracking tag with a battery of a second capacity having a second set of dimensions. Known tracking tags accept only a single type of battery for powering components. This limits the number of real-time location tracking system implementations for the tags.

Embodiments of the disclosure provide an adaptable tracking tag configured for receiving and housing batteries of more than one type for powering various components of the tracking tag. Further, embodiments of the disclosure describe techniques for adaptively reducing power consumption of tracking tags so as to lengthen battery life. Additional aspects, advantages, features and objects of the disclosure will be made apparent from the drawings and the detailed description of the illustrative embodiments construed in conjunction with the appended claims that follow. It will be appreciated that described features are susceptible to being combined in various ways without departing from the scope of the disclosure as defined by the appended claims.

Figure 1:
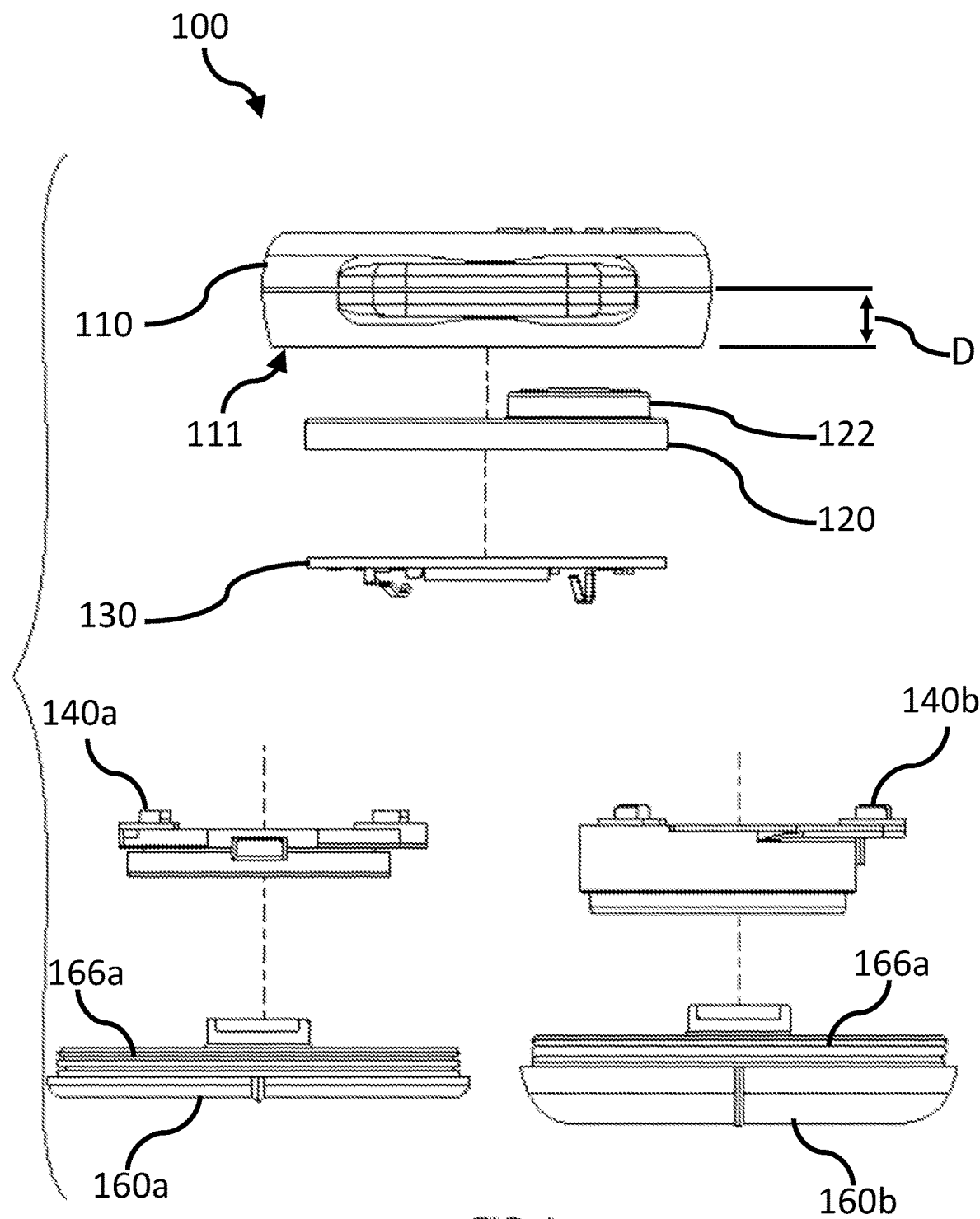
FIG. 1 illustrates example components of an example tracking tag system.

Referring now to the drawings, particularly by their reference numbers, FIG. 1 illustrates example components of an example tracking tag system 100. Tracking tag system 100 includes a tag case 110, first and second battery housings 140*a* and 140*b*, a first tag case back plate 160*a* and a second tag case back plate 160*b*. Tag case 110, is mateable with either tag case back plate at mating surface 111 and is configured to house a printed circuit board (PCB) 130 including sensors, control circuitry and a transmitter such as an RF transmitter. Tag case 110 and the chosen tag case back plate may similarly house separate PCB, sensors and transmitter. Tag case 110 has a case depth D between mating surface 111 and where the PCB rests. An eyelet 114 may be provided as an attachment point for a lanyard, band or similar tether for securing an assembled tracking tag to an asset.

Figure 2:
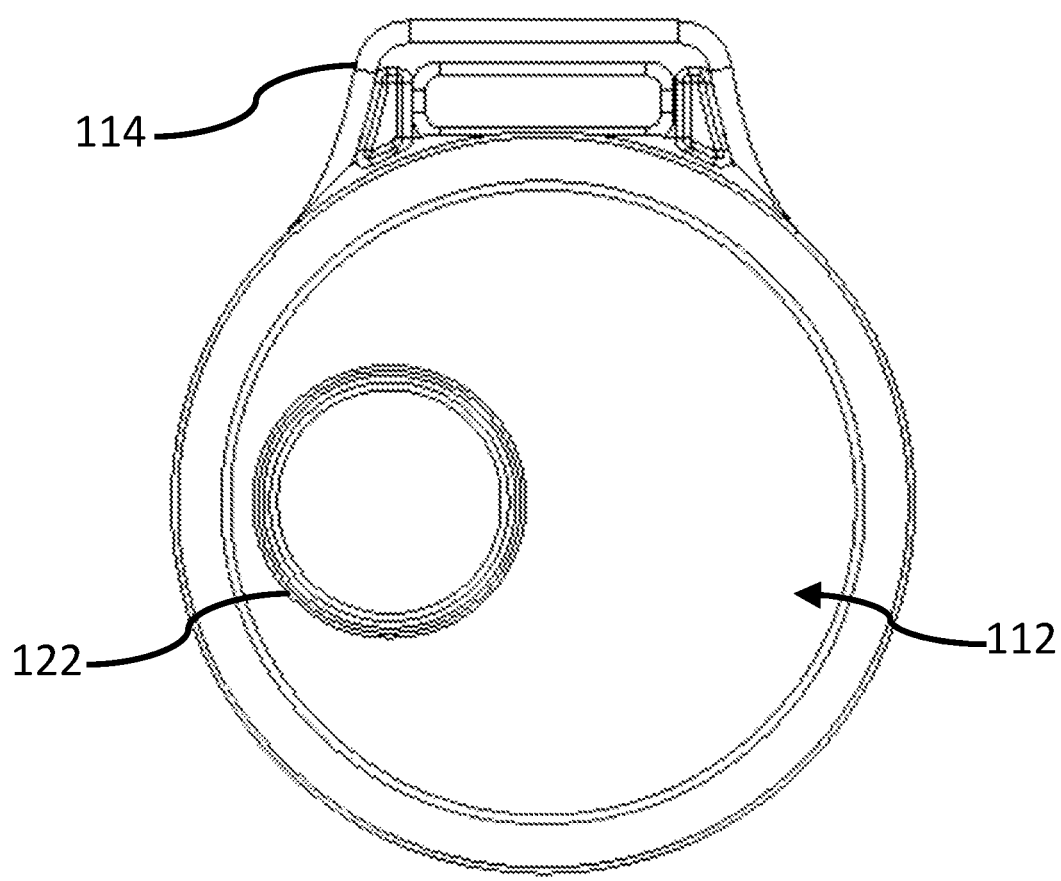
FIG. 2 illustrates a front view of an example tracking tag case.

Tag case 110 also accommodates a push button pad 120 for enabling user selected operation of a switch on PCB 130 to generate a transmission with the transmitter. Referring to FIG. 2, button 122 of push button pad 120 extends through an opening in face 112 of tag case 110 for access by a user of tracking tag system. Depression of button 122 activates the switch of PCB 130 to process a transmission.

The first 140*a* and second 140*b* battery housings (FIG. 1), which may alternatively be considered as battery holders, battery frames, battery shells or battery seats, are configured for receiving and holding batteries for powering components of a tracking tag to which the battery housings are operatively coupled. Components which may be powered by the batteries include but are not limited to transmitters, PCBs 130, processors, sensors, memory and drives. First and second battery housings 140*a* and 140*b* are configured for separate and interchangeable coupling with a PCB such as PCB 130 so that components of a tracking tag may be powered by batteries of different types, varieties, versions, models, capacities, profiles and/or outputs. Example battery types a user may want to interchange in a given tracking tag include but are not limited to 2032 batteries and 2477 batteries.

Figure 3:
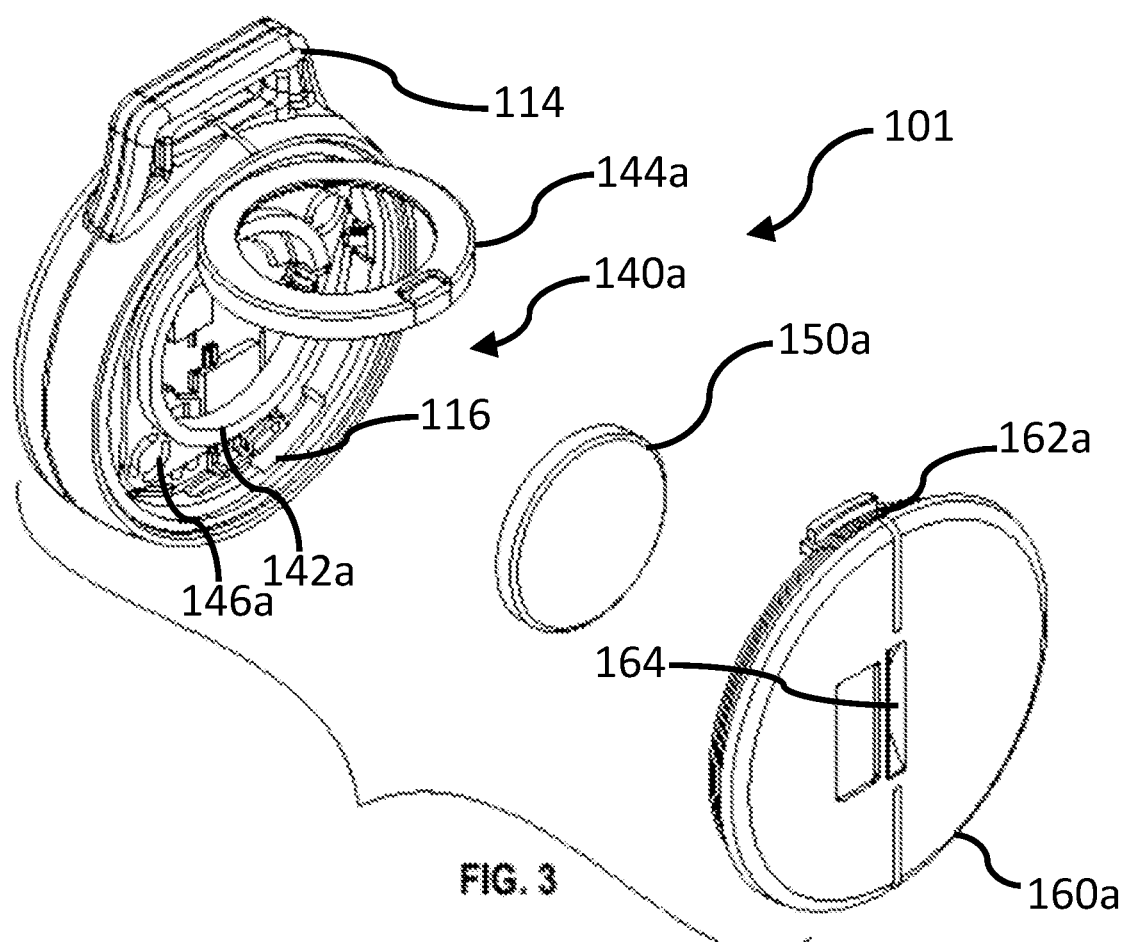
FIG. 3 illustrates an exploded view of an example assembled tracking tag configured for a first battery type.
Figure 4:
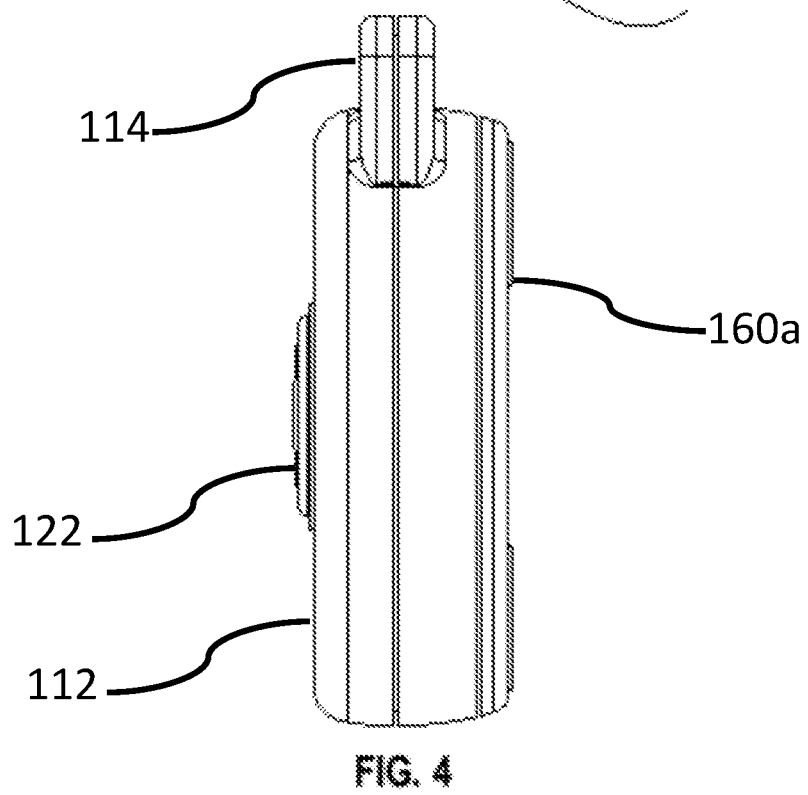
FIG. 4 illustrates a side view of the example tracking tag of FIG. 3.
Figure 5:
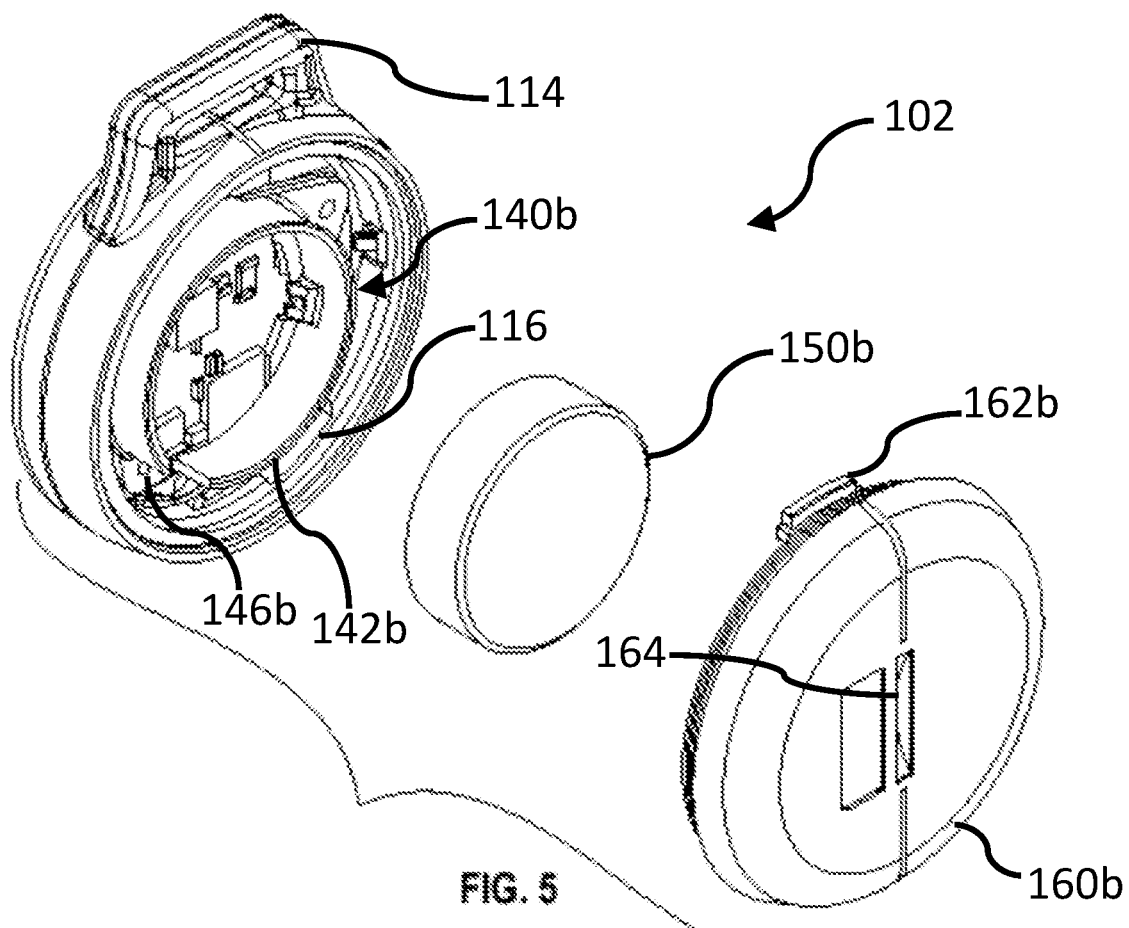
FIG. 5 illustrates an exploded view of an example assembled tag configured for a second battery type.
Figure 6:
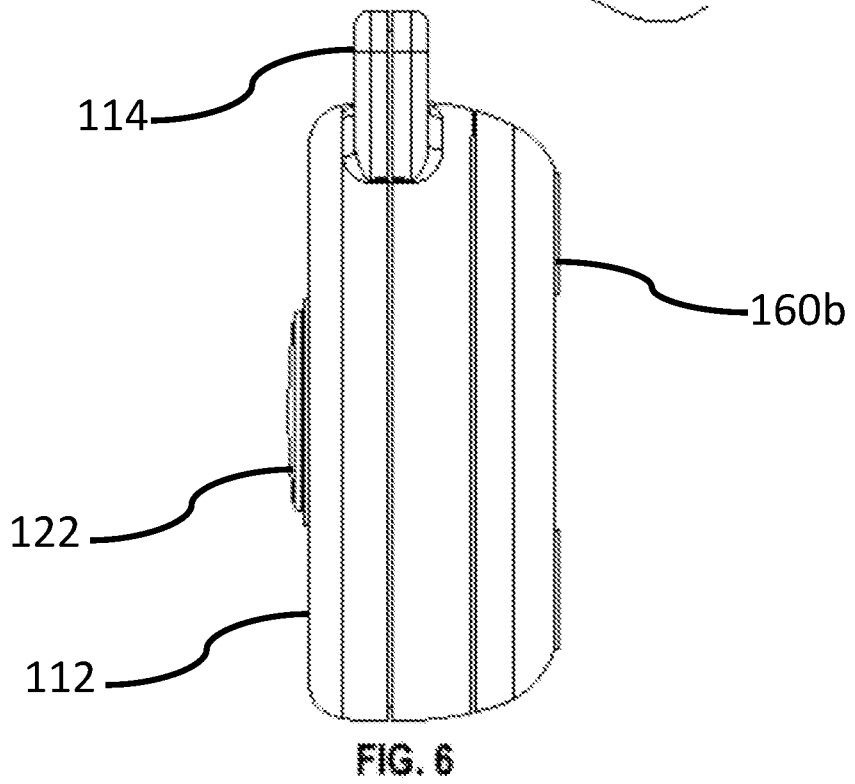
FIG. 6 illustrates a side view of the example tracking tag of FIG. 5.

FIGS. 3 & 4 illustrate an example assembled tracking tag 101 configured for a first battery type. FIGS. 5 & 6 illustrate an example assembled tracking tag 102 configured for a second battery type. First and second tag case back plates 160a and 160b are configured for separate and interchangeable mating with the tag case 110 to enclose a transmitter, a PCB 130 and the first 140a or second 140b battery housings. Referring to FIGS. 3 & 5, each of first and second tag case back plates 160a and 160b may further include tabs 162a and 162b configured to engage slots 116 of an interior wall of tag case 110 and a slot 164 for receiving a user tool or fingernail to facilitate rotation of the associated case back plate 160a, 160b. Tag case back plates 160a and 160b are not limited to engaging with tag case 110 by means of tabs such as tabs 162a and 162b and any of a variety of coupling techniques may be implemented.

Both first tag case back plate 160a and second tag case back plate 160b may be configured to mate with tag case 110 to protect against ingress of water during immersion and against dust ingress. A portion adjacent to tabs 162a and/or 162b and configured for receipt within the tag case may be surrounded by an O-ring 166a to seal mating of first tag case back plate 160a or second tag case back plate to tag case 110 and prevent water ingress during immersion as well as dust ingress. In an example, O-ring 166a supports IP67 ingress protection of disclosed tracking tags in accordance with standard 60529 published by the International Electrotechnical Commission.

First tag case back plate 160a has a first height configured to accommodate a battery housing of a first height and second tag case back plate 160b has a second height configured to accommodate a battery housing of a second height. The first battery housing height may be different from the second battery housing height leading to the second tag case back plate height being different from the first tag case back plate height.

In an example, the height of second tag case back plate 160b is 80% greater than the height of first tag case back plate 160a. First tag case back plate 160a may have a height about 40% of the tag case depth D. Second tag case back plate 160b may have a height about 75% of the tag case depth D.

First battery housing 140a may further include a first battery housing base portion 142a (FIG. 3) configured for mounting to a PCB 130 housed by tag case 110. First battery housing base portion 142a includes two wings/tabs 146a configured for coupling with a PCB such as PCB 130 and may generally take any of a variety of forms suitable for holding a battery. Suitable forms include but are not limited to an annular shape, a rectangular shape or a square shape.

First battery housing 140a may further include a lid 144a pivotably coupled with base portion 142a by, for example, a hinge, to form a clamshell configuration which may be selectively secured in a closed position with a clip. First battery housing lid portion 144a may take a form matching that of battery housing base portion 142a. For example, battery housing lid portion 144a may be annular, rectangular or square. In an alternative, eliminating the need for housing lid portion 144a, a boss on the interior surface of first tag case back plate 160a may hold a battery in battery housing 140a and maintain electrical contact with the battery terminals.

In an example, first battery housing 140a, as mounted to a PCB 130 housed by tag case 110, has a height less than the case depth D such that first battery housing 140a, as mounted to a PCB housed by tag case 110, is recessed within tag case mating surface 111.

Second battery housing 140b further comprises a second battery housing base portion 142b (FIG. 5) which is configured for mounting to PCB 130 housed by tag case 110. Second battery housing base portion 142b includes two wings/tabs 146b configured for coupling with a PCB such as PCB 130 and, as with first battery housing base portion 142a, may generally take any of a variety of forms suitable for holding a battery. Second battery housing 140b may exhibit an open cylinder configuration without a lid portion. In an example, a boss on the interior surface of second tag case back plate 160b may hold a battery in battery housing 140b and maintain electrical contact with the battery terminals.

In an example, base portion 142b of the second battery housing 140b, as mounted to the PCB 130, has a height greater than the case depth D such that second battery housing base portion 142b, as mounted to PCB 130, protrudes above mating surface 111. With an example 2477 battery mounted in second battery housing 140b, the battery extends from the battery housing base portion 140b by about 0.078 in and beyond mating surface 111 by about 0.133 in.

The first and second battery housing base portions 142a and 142b exhibit different dimensions. First battery housing base portion 142a has a first diameter and second battery housing base portion 142b has a second diameter different from the first diameter. For example, the second diameter may be greater than the first diameter. In a further example, the second diameter may be greater than the first diameter by about 20%. In a still further example, first battery housing base portion diameter may be about 0.787 in. while second battery housing base portion diameter may be about 0.945 in.

Battery housing base portions 142a and 142b also have first and second heights, respectively, which may be different. For example, the second height may be greater than the first height. In a further example, the second height may be greater than the first height by about 50%. In a still further example, first battery housing base portion height may be about 0.154 in. while second battery housing base portion height may be about 0.275 in.

The difference between the height of first battery housing 140a and the height of the second battery, as housed by second battery housing 140b, may be approximately equal to or about, generally or substantially the same as the difference between the internal height of first tag case back plate 160a and the internal height of second tag case back plate 160b. For example, the difference between the height of first battery housing 140a and the height of the second battery, as housed by second battery housing 140b, may be within 0.1 in. of the difference between the internal height of first tag case back plate 160a and the internal height of second tag case back plate 160b.

In another example, battery housings may be mounted to the first and second tag case backs 160a and 160b for operative coupling with PCB 130 upon mating tag case back 160a or tag case back 160b to tag case 110 thus eliminating the need for mounting first and second battery housings 140a and 140b directly to PCB 130.

Tag case 110 and tag case back plates 160a and 160b may be formed from any of a variety of durable, water-resistant materials including but not limited to plastic. Tag case 110 and tag case back plates 160a and 160b may be manufactured as two pieces ultrasonically welded into a single, integral piece. An example manufacturing tolerance is 0.05 in.

While tracking tag systems are disclosed as explicitly including first and second battery housings, first and second tag case back plates and first and second batteries, some example tracking tag systems may include more than two battery housing types and more than two tag case back plates so that more than two battery types can be supported through reconfiguration.

Figure 7:
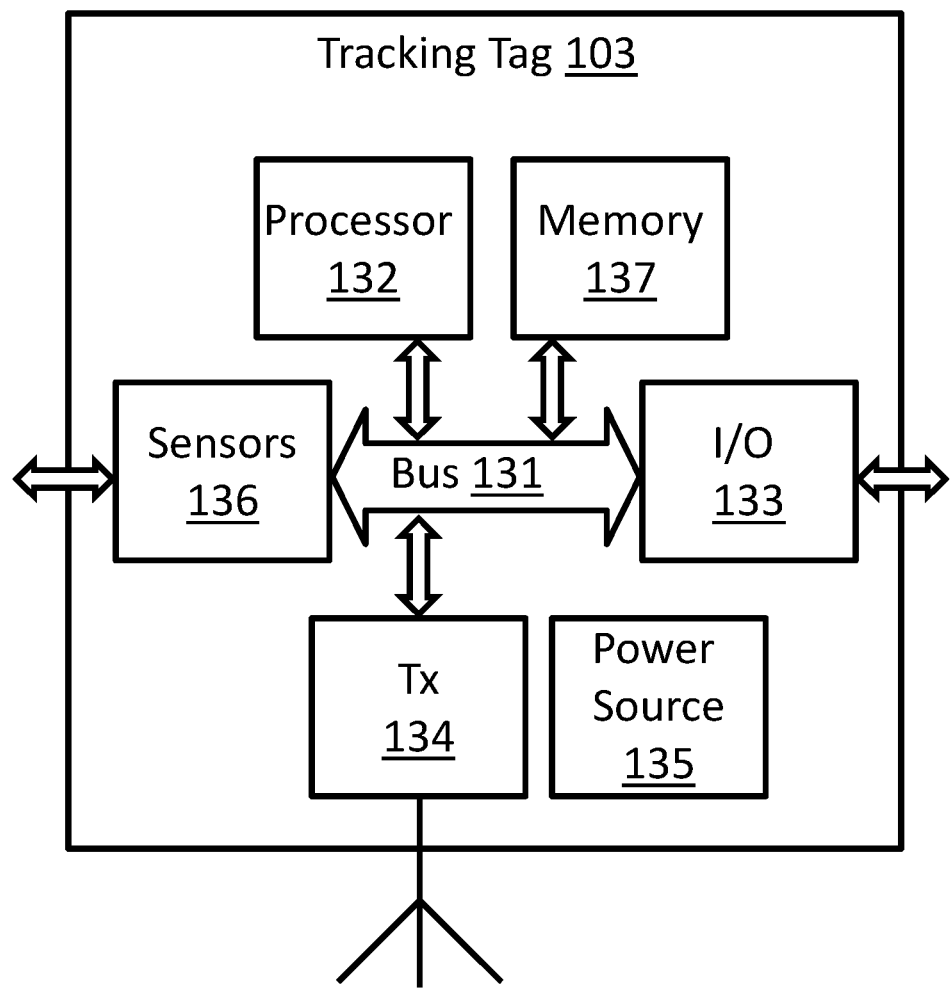
FIG. 7 schematically illustrates an example implementation of the tracking tags of FIGS. 3-6.

According to another adaptable feature of disclosed tracking tags, the ping rate of beacon signals transmitted by tracking tag 100 may be changed according to the use of the tag as determined by one or more sensors. FIG. 7 illustrates an example tracking tag 103 for carrying by or on an asset to be tracked at a site. Tracking tag 103 may be an implementation of tracking tag 101, tracking tag 102 or an implementation incorporating features of both tracking tag 101 and tracking tag 102.

Tracking tag 103 may include, but is not limited to, a memory 137, computing hardware such as a processor or microprocessor 132, Input/Output (I/O) devices 133, a transmitter 134 or transceiver and a configuration of sensors 136. A system bus 131 may operatively couple various components including memory 137, processor 132, I/O devices 133 and sensors 136 or more than one of processor 132, I/O devices 133, transmitter 134 and memory 137 may be provided together on a single system-on-a-chip.

Memory 137 may include non-removable memory. The non-removable memory, for example, includes Random-Access Memory (RAM) and/or flash memory.

Radio frequency signal transmitter 134 is configured to transmit a beacon signal with unique identification information of the tracking tag. Unique identification information may be, for example, a network address, a MAC address, a short address, a human-readable address or a name of the asset. In an example, radio frequency signal transmitter 134 transmits beacon signals at 2.4 GHz as frequently as once every 0.5 seconds or as infrequently as once every 32 seconds.

Radio frequency signal transmitter 134 may be further configured to transmit an alert signal. Alert signals may be initiated by transmitter 134 when, for example, button 122 (FIG. 1) is pressed. Alert signals may be designated by data included in the beacon signal. For example, one or more digits or bits of the beacon signal may indicate the state of the alert such that a '0' may indicate no alert while a '1' indicates an alert. Further, one or more digits or bits may indicate alert type such as button pushed, person down, etc.

I/O devices 133 may include a plurality of LEDs. In an example, one LED indicates a state of power source 135 and one LED indicates network connection status. One or more other LEDs may indicate one or more other states of the tracking tag 103 or components thereof including but not limited to an alert state. I/O devices 133 may further include one or more push buttons for various on-demand communication. I/O devices 133 may include one or more buttons such as button 122 for producing, for example, an alert transmission with transmitter 134.

A power source 135 such as one or more batteries or cells supplies electrical power to components of tracking tag 103 including processor 132, I/O devices 133, signal transmitter 134 and sensors 136. Power source 135 may incorporate battery 150*a*, 150*b* or a combination of batteries 150*a* and 150*b*.

Sensors 136 may include an accelerometer for measuring the motion of tracking tag 103. The accelerometer is able to differentiate between at least first, second, third and fourth motion states of tracking tag 103. In an example, the first state is a shelf state in which the tracking tag is not coupled with an active asset and/or is experiencing very low motion occurrence. In an example, the second state is a sit/stand state in which an asset with which tracking tag 103 is associated is sitting, standing or otherwise in a generally upright orientation without changing position or location. In an example, the third state is a walk state in which an asset with which tracking tag 103 is associated is moving at a normal human walking pace or the tracking tag 103 is experiencing motion consistent with a normal human walking cadence. In an example, the fourth state is a running state in which an asset with which tracking tag 103 is associated is moving faster than a normal human walking pace or the tracking tag 103 is experiencing motion consistent with a normal human running cadence.

Depending on the motion state determined by the accelerometer, circuitry of tracking tag 103, including processor 132 controls transmitter 134 to emit beacon signals at a rate appropriate for the motion state of tracking tag 103. Transmitter 134 may, for example, emit beacon signals at a low rate in the first state since the tag is inactive. Transmitter 134 may, for example, emit beacon signals at a medium rate in the second state since the tracking tag is active but not changing location or position. Transmitter 134 may, for example, emit beacon signals at a high rate in the third state when the tracking tag is active and changing location and/or position. Transmitter 134 may, for example, emit beacon signals at a very high rate in the fourth state since the tracking tag is active and changing location and/or position quickly.

Disclosed tracking tags may perform a method for emitting pings at varying or variable rates or intervals. The processor determines motion state of the tag and/or transmitter from accelerometer measurements, evaluates whether the motion state has changed since the last determination and, if the motion state has changed, changes or adjusts the ping rate to correspond with the motion state.

In a more resource conscious implementation, the accelerometer differentiates between only first and second motion states of tracking tag 103 wherein the first state is stationary and the second state is moving.

Since the tracking tag will consume less electrical power at lower beacon signal emission rates, with the accelerometer and programming of the processor 132, tracking tag 103 is configured to adapt battery use to the needs of a tracking system depending on the state of the tracking tag and its associated asset.

The interchangeability of the battery housings and case back plates enables reconfiguring a tracking tag. For example, a tracking tag 101 may be reconfigured into a tracking tag 102 and back to a tracking tag 101. According to a method for reconfiguring a real-time location tracking tag, a first tag case back is uncoupled from a first tag case. The tag case may house a communicatively coupled PCB and transmitter pair. The first tag case back plate may be uncoupled from the tag case by unlocking. One or more tabs or wings of the first tag case back plate may be removed from one or more slots in the tag case. For example, the first tag case back plate may be rotated some number of revolutions and/or fraction thereof relative to the tag case until the tabs are aligned with the slots and the tag case back plate can be translated away from the tag case. An O-ring for sealing the first tag case back plate to the tag case to prevent water ingress during immersion and against dust ingress may be removed from the first tag case back.

Then, a first battery housing base portion mounted to the PCB and having a first height and first diameter is removed. For example, bosses or studs of the battery housing base portion are removed from holes of the PCB. If an adhesive has previously been used to secure the battery housing base portion to the PCB the adhesive may be dissolved or otherwise removed.

A battery of a first type may be removed from the first battery housing while the first battery housing is still mounted to the PCB or the first battery housing and first type of battery may be removed from the PCB together and the battery subsequently removed from the housing. In either case, the battery of a first type is removed from a base portion of the first battery housing. Depending on which battery type the tracking tag is being reconfigured for, removing the battery of a first type from the first battery housing may include pivoting a lid portion of the first battery housing relative to a base portion of the first battery housing or just simply pulling the battery straight out from an open cylinder battery housing. While the battery of the first type which is removed from the first battery housing may take any of a variety of forms, in an example, the battery of the first type is a 2032 battery.

With the first battery housing removed, a second battery housing is mounted to the PCB. The second battery housing may be mounted to the PCB by mounting a second base portion having a second height different from the first height and a second diameter different from the first diameter. Bosses of the second battery housing base portion are received in holes of the PCB and the battery housing is secured to the PCB with an adhesive.

A battery of a second type may be provided to the second battery housing base portion after the second battery housing is mounted to the PCB or the second type of battery may be provided to the second battery housing before the second battery housing is mounted to the PCB such that the second battery housing and second type of battery may be mounted from the PCB together. In yet another example, a battery of a second type may be provided at a later time. While the battery of the second type, which is provided to the second battery housing, may take any of a variety of forms, in an example, the battery of the second type is a 2477 battery.

Again, depending on which battery type the tracking tag is being reconfigured for, providing the battery of the second type to the second battery housing may include pivoting a lid portion of the second battery housing relative to a base portion of the second battery housing to grip the battery of the second type.

The O-ring removed from the first tag case back plate may be provided to a second tag case back plate for sealing the second tag case back plate to the tag case to prevent water ingress during immersion and against dust ingress. Alternatively, a new O-ring may be provided to the second tag case back plate.

The second tag case back plate, which may have a second height different from the first height, is then lockingly engaged to the tag case to enclose the PCB, transmitter and second battery housing. The second tag case back plate may be lockingly engaged by providing one or more wings or tabs of the second tag case back plate to one or more slots in the tag case. For example, the tag case back plate may be translated toward the tag case such that the tabs are inserted into one or more slots and then the tag case back plate may be rotated some number of revolutions and/or fraction thereof relative to the tag case until the tabs are misaligned with the slots and the tag case back plate cannot be simply translated away from the tag case.

While the method for reconfiguring a real-time location tracking tag has been described so as to reconfigure a tracking tag from being suitable for use with a first battery to being suitable for use with a second battery, the method may similarly reconfigure a tracking tag from being suitable for use with the second battery to being suitable for use with the first battery. It should be noted that the terms "first", "second", and the like, herein do not denote any order, quantity, or importance, but rather are used to distinguish one element from another. Further, the terms "a" and "an" herein do not denote a limitation of quantity, but rather denote the presence of at least one of the referenced item.

The actions described above with regard to a method of reconfiguring a tracking tag are only illustrative and other alternatives can also be provided where one or more actions are added, one or more actions are removed, or one or more actions are provided in a different sequence without departing from the scope of the claims herein.

Embodiments of the disclosure are susceptible to being used for various purposes, including, though not limited to, enabling users to configure a real-time location tracking tag for receiving and housing batteries of one of a variety of battery types for powering various components of a tracking tag.

Modifications to embodiments of the disclosure described in the foregoing are possible without departing from the scope of the disclosure as defined by the accompanying claims. Expressions such as "including", "comprising", "incorporating", "consisting of", "have", "is" used to describe and claim disclosed features are intended to be construed in a non-exclusive manner, namely allowing for items, components or elements not explicitly described also to be present. Reference to the singular is also to be construed to relate to the plural.

What is claimed is:

1. A location tracking tag system, comprising:
a tag case which has a mating surface and is configured to house a printed circuit board having a transmitter and circuitry for controlling the transmitter;
configured for separate and interchangeable coupling with a printed circuit board housed by the tag case:
a first battery housing with a base portion having a first height; and
a second battery housing with a base portion having a second height; and
configured for separate and interchangeable mating with the tag case:
having a first height, a first tag case back plate configured to cooperate with the tag case to enclose and protect the printed circuit board, the transmitter, the circuitry and a battery of a first type against ingress of foreign matter and to enclose the first battery housing; and
having a second height different from the first height, a second tag case back plate configured to cooperate with the tag case to enclose and protect the printed circuit board, transmitter, the circuitry and a battery of a second type against ingress of foreign matter and to enclose the second battery housing; and
wherein the difference between the height of the base portion of the first battery housing and the height of the base portion of the second battery housing is about the same as the difference between the height of the first tag case back plate and the height of the second tag case back plate.

2. The location tracking tag system as set forth in claim 1, wherein:
to protect the printed circuit board, the transmitter, the circuitry and the battery of the first type against ingress of foreign matter, the first tag case back plate is provided with an O-ring surrounding a portion of the first tag case back plate configured for receipt within the tag case; and to protect the printed circuit board, the transmitter, the circuitry and the battery of the second type against ingress of foreign matter, the second tag case back plate is provided with an O-ring surrounding a portion of the second tag case back plate configured for receipt within the tag case.

3. The location tracking tag system as set forth in claim 1, wherein:

the first battery housing further comprises a first battery housing base portion which is configured for coupling to a printed-circuit board housed by the tag case and has a first diameter; and the second battery housing further comprises a second battery housing base portion which is configured for coupling to a printed circuit board housed by the tag case and has a second diameter different from the first diameter.

4. A variable ping, tracking tag system, comprising:
a transmitter configured to emit signals at a ping rate;
an accelerometer configured to measure a motion state of the transmitter;
a printed circuit board having circuitry for controlling the transmitter and for adapting the ping rate according to the motion state measured by the accelerometer;
a tag case housing the transmitter, the accelerometer and the printed circuit board; and
first and second battery housings configured for separate and interchangeable coupling with the printed circuit board.

5. The tracking tag system as set forth in claim 4, further comprising, configured for separate and interchangeable mating with the tag case, a first tag case back plate configured to enclose the transmitter, the printed circuit board and a first battery housing and a second tag case back plate configured to enclose the transmitter, the printed circuit board and a second battery housing.

6. The tracking tag system as set forth in claim 5, wherein the first tag case back plate has a first height and the second tag case back plate has a second height different from the first height.

7. The tracking tag system as set forth in claim 4, wherein the first battery housing further comprises a base portion having a first height and the second battery housing further comprises a base portion having a second height different from the first height.

8. The tracking tag system as set forth in claim 4, wherein the first battery housing further comprises a base portion having a first diameter and the second battery housing further comprises a base portion having a second diameter different from the first diameter.

9. A method for reconfiguring a tracking tag, comprising:
from a tag case housing a printed circuit board having a transmitter and circuitry for controlling the transmitter, uncoupling a first tag case back plate having a first height;
from the printed circuit board, removing a first battery housing mounted thereto and having a first base portion with a first height;
to the printed circuit board, mounting a second battery housing having a second base portion with a second height different from the first height; and
to the tag case, to enclose the printed circuit board and transmitter and second battery housing, coupling a second tag case back plate having a second height different from the first tag case back plate height such that the difference between the height of the base portion of the first battery housing and the height of the base portion of the second battery housing is about the same as the difference between the height of the first tag case back plate and the height of the second tag case back plate.

10. The method as set forth in claim 9, further comprising:
removing a battery of a first type from the first battery housing mounted to the printed circuit board; and
providing a battery of a second type to the second battery housing.

11. The method as set forth in claim 9, wherein:
the removing the first battery housing from the printed circuit board further comprises removing a first base portion having a first diameter; and
the mounting the second battery housing to the printed circuit board further comprises mounting a second base portion having a second diameter different from the first diameter.

12. The method as set forth in claim 9, further comprising:
removing a battery of a first type from the first battery housing mounted to the printed circuit board;
providing a battery of a second type to the second battery housing; and
wherein one of removing the battery of the first type or providing the battery of the second type further includes pivoting a lid of one of the first and second battery housings.

13. The method as set forth in claim 9, further comprising:
removing an O-ring from the first tag case back plate; and
from the printed circuit board, removing a first battery housing mounted thereto;
to the printed circuit board, mounting a second battery housing; and
providing the O-ring to the second tag case back to prevent ingress of foreign materials into the coupled second tag case back plate and tag case.

* * * * *